(12) United States Patent
Hara et al.

(10) Patent No.: US 7,948,058 B2
(45) Date of Patent: May 24, 2011

(54) SEMICONDUCTOR DEVICE AND SEMICONDUCTOR INTEGRATED CIRCUIT DEVICE FOR DRIVING PLASMA DISPLAY USING THE SEMICONDUCTOR DEVICE

(75) Inventors: Kenji Hara, Hitachi (JP); Junichi Sakano, Hitachi (JP); Shinji Shirakawa, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 513 days.

(21) Appl. No.: 12/103,911

(22) Filed: Apr. 16, 2008

(65) Prior Publication Data
US 2008/0265278 A1    Oct. 30, 2008

(30) Foreign Application Priority Data
Apr. 18, 2007   (JP) .................. 2007-108802

(51) Int. Cl.
*H01L 29/00*    (2006.01)
(52) U.S. Cl. .............. 257/557; 257/575; 257/E27.032
(58) Field of Classification Search ................ 257/556, 257/557, 565, 575, E27.023, E27.032, E27.043
See application file for complete search history.

(56) References Cited

U.S. PATENT DOCUMENTS
2004/0262696 A1 * 12/2004 Ronsisvalle ............. 257/378

FOREIGN PATENT DOCUMENTS
JP            09-121046          5/1997
* cited by examiner

*Primary Examiner* — Hoai v Pham
(74) *Attorney, Agent, or Firm* — Antonelli, Terry, Stout & Kraus, LLP.

(57) ABSTRACT

A lateral IGBT structure having an emitter terminal including two or more base layers of a second conductivity-type for one collector terminal, in which the base layers of a second conductivity-type in emitter regions are covered with a first conductivity-type layer having a concentration higher than that of a drift layer so that a silicon layer between the first conductivity-type layer covering the emitter regions and a buried oxide film has a reduced resistance to increase current flowing to an emitter farther from the collector to thereby enhance the current density.

14 Claims, 6 Drawing Sheets

SEMICONDUCTOR DEVICE AND SEMICONDUCTOR INTEGRATED CIRCUIT DEVICE FOR DRIVING PLASMA DISPLAY USING THE SEMICONDUCTOR DEVICE

BACKGROUND OF THE INVENTION

The present invention relates to lateral insulated-gate bipolar transistors (hereafter, referred to as "IGBT") and semiconductor integrated circuits for driving a plasma display using such transistors.

Recently, many high blocking voltage power ICs using an SOI substrate have been developed because of their features such that they only need small device isolation areas and are free from parasitic transistors. In developing high blocking voltage power ICs, it will be essential from the viewpoint of the output performances and chip size reduction that high blocking voltage power ICs which directly drive loads should have enhanced performances. However, in the lateral IGBTs, which are mainly employed as output devices in power ICs using an SOI substrate, emitter-gate regions and collector regions are formed on the same surface, which limits a substantial current conduction area to reduce the current capacity per device area.

Furthermore, since the lateral IGBT has a large current component in a direction laterally of the device, it suffers a problem such that the latch-up tends to occur and the range of stable operation of the device is narrow. In consideration of this problem, lateral IGBTs having an increased current capacity per unit area and a wider range of safe operation have been developed, as disclosed, for example, in the specification of Japanese Patent 3,522,983.

According to the features of the lateral IGBT described in the specification of Japanese Patent 3,522,983, in contrast to the usual lateral IGBT in which collector regions and emitter-gate regions are alternately arranged, a plurality of emitter-gate regions are provided between adjacent collector regions. By this structure, it is possible to increase the current capacity without extending the device area and to realize a decrease of the on-voltage.

SUMMARY OF THE INVENTION

However, with the IGBTs of the above-described conventional structure, those of the plural emitter-gate regions, provided between collector regions, which are farther from the collector regions concerned suffer a problem of an increased voltage drop with a result that the intensity of current allowed to flow may not be high to pose an obstacle to exhibition of full performances.

It is an object of the present invention to provide an IGBT having a device structure in which the current density is enhanced as compared to that having the conventional structure.

It is another object of the present invention to provide a semiconductor integrated circuit which realizes a high blocking voltage and large current control when employed as a semiconductor integrated circuit.

In order to solve the above problems, a semiconductor device according to an aspect of the present invention includes: second conductivity-type base regions formed in a surface layer at a main surface of a first conductivity-type semiconductor substrate, each base region having therein a first conductivity-type emitter region; at least one gate electrode formed above the second conductivity-type base regions between the first conductivity-type semiconductor substrate and the first conductivity-type emitter regions; and second conductivity-type collector regions, at least two second conductivity-type base regions being provided between adjacent second conductivity-type collector regions; wherein a first conductivity-type region, having a concentration higher than that of the first conductivity-type semiconductor substrate, is provided between the at least two second conductivity-type base regions and under the at least two second conductivity-type base regions.

In order to solve the above problems, a semiconductor device according to an other aspect of the present invention includes: second conductivity-type base regions formed in a surface layer at a main surface of a first conductivity-type semiconductor substrate, each base region having therein a first conductivity-type emitter region; at least one gate electrode formed above the second conductivity-type base regions between the first conductivity-type semiconductor substrate and the first conductivity-type emitter regions; and second conductivity-type collector regions, at least two second conductivity-type base regions being provided between adjacent second conductivity-type collector regions; wherein a first conductivity-type region, having a concentration higher than that of the first conductivity-type semiconductor substrate, is provided to surround the at least two second conductivity-type base regions.

In order to solve the above problems, a semiconductor device of the type described above is employed as a semiconductor integrated circuit device for driving a plasma display.

With a lateral IGBT according to an aspect of the present invention in which a silicon layer between a first conductivity-type, high concentration layer newly provided for covering emitter-gate regions and a buried oxide film is made to have a reduced resistance to increase current flowing to an emitter farther from a collector, whereby it is possible to enhance the current density as compared with the conventional structure.

In addition, the enhancement of the current density in the lateral IGBT makes it possible to realize, in a more reduced size, a semiconductor integrated circuit for driving a plasma display which will require a high blocking voltage and a large current.

The present invention may be applied to a lateral insulated-gate bipolar transistor (IGBT) formed on an SOI substrate, and the present invention relates to semiconductor integrated circuits for driving a plasma display which employ insulated-gate bipolar transistors (IGBTs).

Other objects, features and advantages of the invention will become apparent from the following description of the embodiments of the invention taken in conjunction with the accompanying drawings.

DETAILED DESCRIPTION OF THE INVENTION

Embodiments of the present invention will now be described with reference to the accompanying drawings.

EMBODIMENT 1

Figure 1:
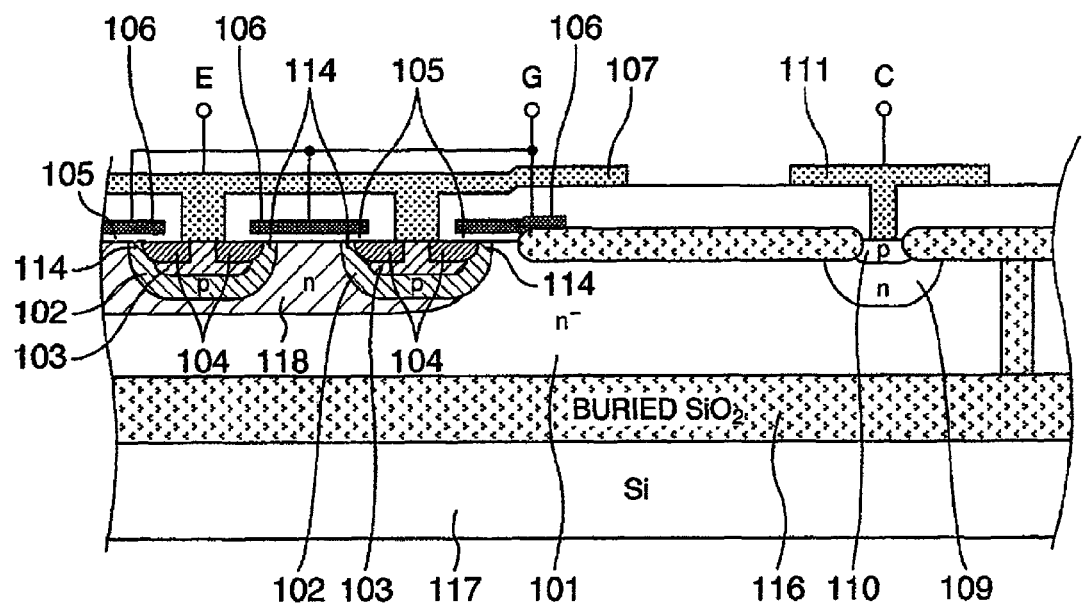
FIG. 1 is a sectional structural diagram showing a semiconductor device according a first embodiment of the present invention.

FIG. 1 is a sectional structural diagram showing a part of an IGBT according an embodiment of the present invention.

In FIG. 1, a buried oxide film 116 is formed on a Si support substrate 117 of an SOI substrate. Plural p-base regions 102 are formed selectively in a surface layer of an n-type semiconductor substrate 101. Two n-emitter regions 104 are formed in portions of a surface layer of each p-base region 102. A p-contact region 103 is formed, in each p-base region 102, between the two n-emitter regions 104 with its portions being overlapped with the two n-emitter regions 104. Plural n-buffer regions 109 are formed selectively in those of exposed surface portions of the n-type substrate 1 in which the p-base regions 102 are not formed. A p-collector region 110 is formed in a surface layer of each n-buffer region 109. Gate electrodes 106, which are connected with gate terminals (hereafter, referred to as "G-terminal"), are provided above a surface of a channel region 114 in a surface layer of each p-base region 102 through a gate oxide film 105. An emitter electrode 107 is provided in common contact with the surfaces of the n-emitter regions 104 and the p-contact regions 103, and collector electrodes 111 are provided on the surfaces of the p-collector regions 110. The emitter electrode 107 and collector electrodes 111 are connected to an emitter terminal (hereafter, referred to as "E-terminal") and collector terminals (hereafter, referred to as "C-terminal"), respectively. And, this structure is featured in that an n-layer 118 having a concentration higher than that of the n-type semiconductor substrate 101 is formed in such a manner that the n-layer 118 covers the p-base regions 102 which are in the central portion of one device. Preferably, the n-type semiconductor substrate 101 should have a thickness not larger than 5 μm and should have an impurity concentration not lower than $5.0 \times 10^{11}$ cm$^{-2}$ and not higher than $5.0 \times 10^{12}$ cm$^{-2}$. With the IGBT according to the present invention, the silicon layer between the high concentration n-layer 118 of the first conductivity-type, newly provided for covering the emitter regions, and the buried oxide film 116 is made to have a reduced resistance, whereby current is also permitted to flow in the emitter-gate region farther from the collector region concerned without an increase of the voltage drop to enhance the current density as compared with the conventional structure.

Figure 2:
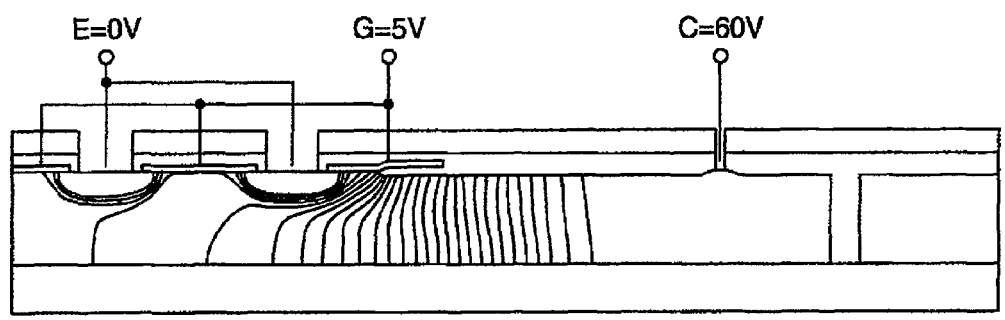
FIG. 2 is a voltage distribution diagram for a semiconductor device in an on-state according to the present invention.

FIG. 2 shows confirmation results of device simulation of an internal voltage distribution in a newly developed lateral IGBT under conditions such that 0 V is applied to the emitter electrode, 5 V is applied to the gate electrode, the device being held in an on-state, state, and 60 V is applied to the collector electrodes. The newly developed IGBT is only differentiated from the conventional one in that the n-layer 118 having a concentration higher than that of the n-type semiconductor substrate 1 is formed, as shown in FIG. 1. For the rest, they are under the same conditions. In the drawings, the solid lines in the n-type semiconductor substrate represent equipotential lines with adjacent lines having a potential difference of 3V. It can be understood from FIG. 2 that, by the newly developed IGBT structure, the region under the emitter electrode farther from the collector electrode is made to have a reduced resistance and larger current is permitted to flow in the emitter electrode farther from the collector electrode as compared with the conventional IGBT structure. This functional effect is remarkable particularly in a region in which the collector-emitter voltage is low, and is useful for lowering the on-voltage.

Figure 3:
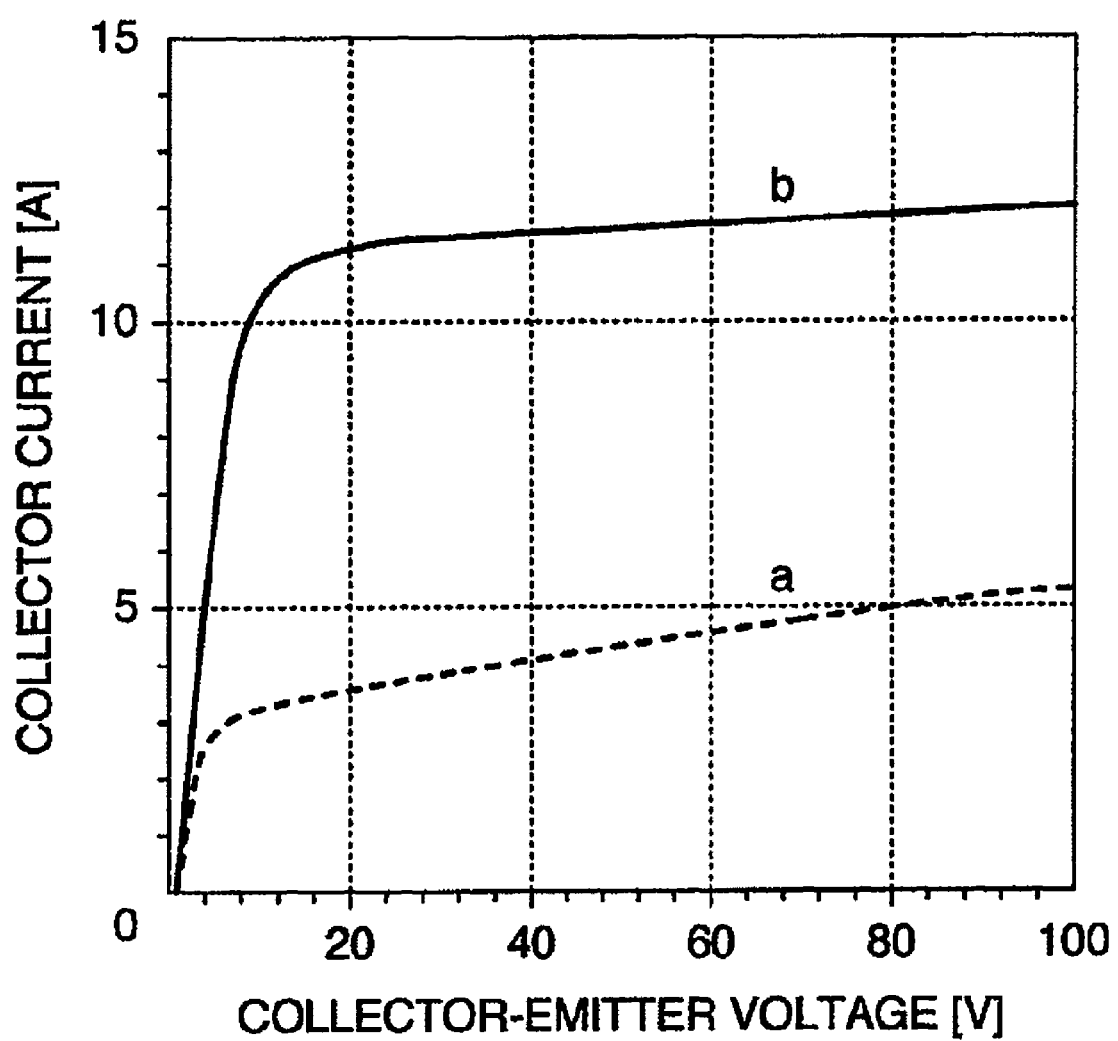
FIG. 3 is a characteristic diagram of a semiconductor device according to the present invention.

FIG. 3 is a characteristic diagram of a lateral IGBT according to the prior art and that newly developed. In the drawing, the abscissa represents the collector-emitter voltage, and the ordinate represents the collector current. The characteristic of the prior art IGBT is denoted by "a", and that of the newly developed IGBT is denoted by "b". The gate electrode is at 5 V. With the newly developed IGBT, current flowing with a collector-emitter voltage of 10V is almost three times as large as that flowing in the prior art IGBT.

By enhancing the current density in the lateral IGBT as described above, it is possible to realize, in a reduced chip size, a semiconductor integrated circuit for driving a plasma display which requires a high blocking voltage and a large current. Although explanations have been made on an n-channel lateral IGBT, it can be explained by reversing the conductivity type in the structure described above that similar effect can be enjoyed with a p-channel lateral IGBT.

Figure 4:
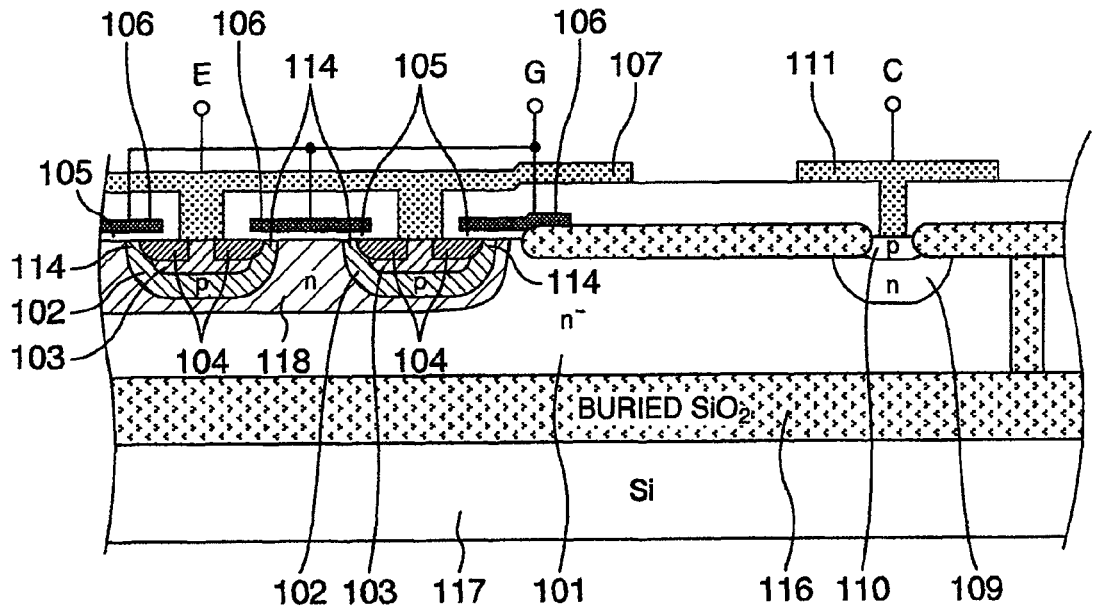
FIG. 4 is a sectional structural diagram of a semiconductor device according a second embodiment of the present invention.

FIG. 4 is a sectional structural diagram showing a second embodiment of the present invention.

The structure shown in this drawing is featured in that the n-layer 118 having a concentration higher than that of the n-type semiconductor substrate 101 is formed in such a manner that the n-layer 118 in this embodiment covers the whole of the p-base regions 102 which are in the central portion of the lateral IGBT such as shown in FIG. 1. With the IGBT according to this embodiment of the present invention, the silicon layer between the high concentration n-layer 118 of the first conductivity-type, newly provided for covering the emitter regions, and the buried oxide film 116 is made to have a reduced resistance, whereby current is also permitted to flow in the emitter-gate region farther from the collector region concerned without an increase of the voltage drop to enhance the current density as compared with the conventional structure.

Figure 5:
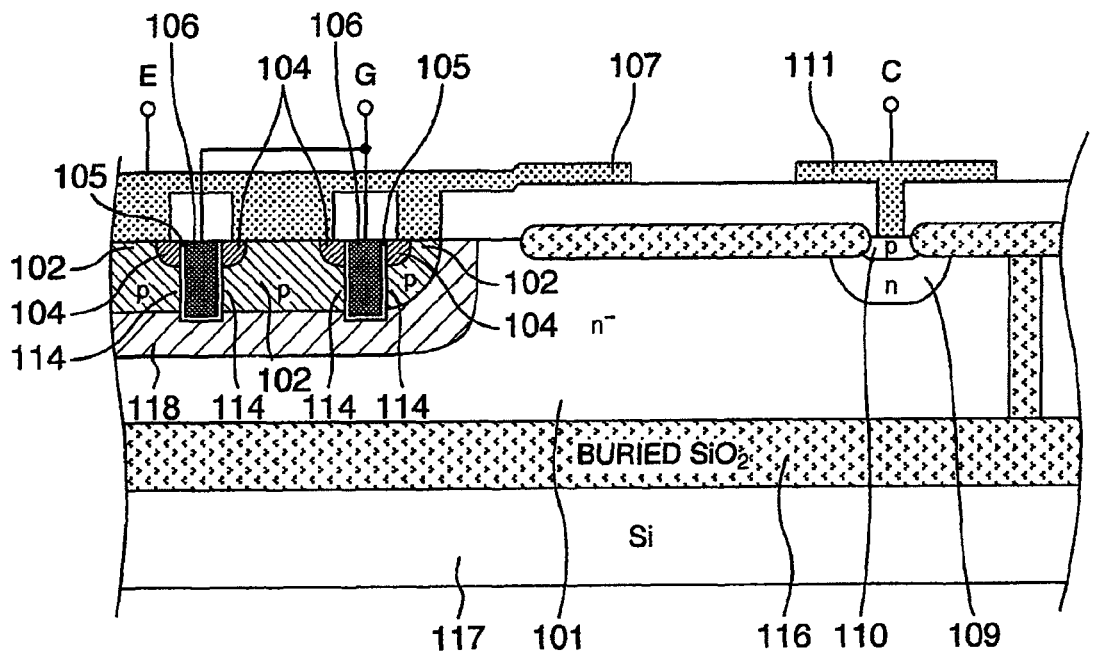
FIG. 5 is a sectional structural diagram of a semiconductor device according a third embodiment of the present invention.

FIG. 5 is a sectional structural diagram showing a third embodiment of the present invention.

The structure shown in this drawing is featured in that the lateral IGBT such as shown in FIG. 1 has now an insulated gate in a trench gate structure. Thus, also with the IGBT having a trench gate structure as shown in FIG. 5, provision of the high concentration layer 118 of the first conductivity-type in a similar manner to the embodiments shown in FIGS. 1 and 4 makes it possible to enhance the current density.

Figure 6:
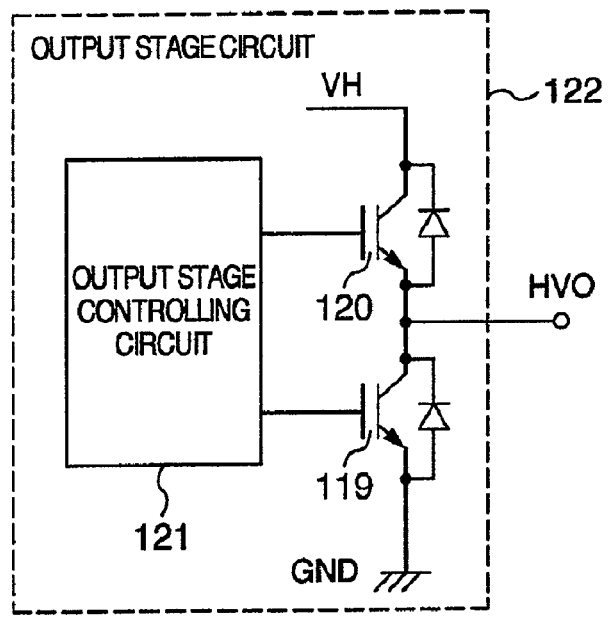
FIG. 6 is a diagram showing an example of a structure of an output stage circuit of a semiconductor integrated circuit device for driving a plasma display using a semiconductor device according to the present invention.

FIG. 6 is a diagram showing an example of a structure of an output stage circuit of a semiconductor integrated circuit device for driving a plasma display to which a lateral IGBT according to the present invention is applied. The output stage circuit 122 has a structure in which IGBTs 119 and 120 according to the present invention are in a totem pole connection between a power source 122 and the GND, with the junction between the IGBTs 119 and 120 constituting an output terminal HVO. The IGBTs 119 and 120 are on-off controlled by an output stage controlling circuit 121 to place the output terminal HVO at a VH voltage level, at the GND voltage level or in a high impedance state.

Figure 7:
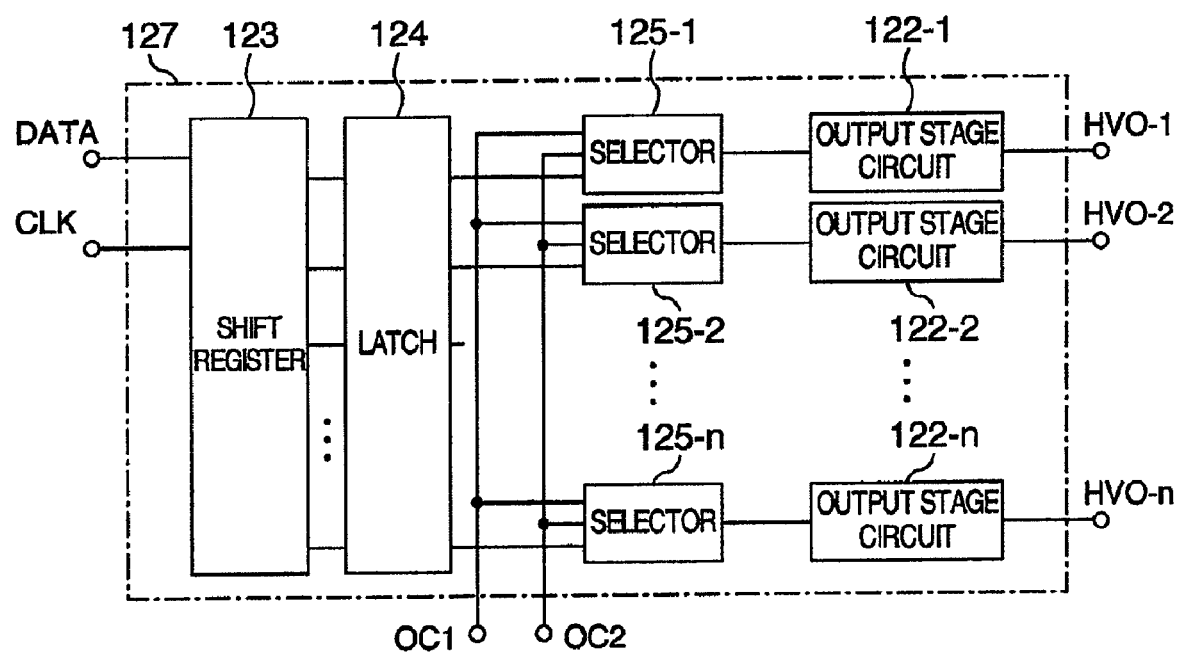
FIG. 7 is a diagram showing an example of a structure of a semiconductor integrated circuit device for driving a plasma display to which a semiconductor device according to the present invention is applied.

FIG. 7 is a diagram showing an example of a structure of a semiconductor integrated circuit device for driving a plasma display to which a lateral IGBT according to the present invention is applied. The semiconductor integrated circuit device 127 for driving a plasma display includes a shift register circuit 123, a latch circuit 124, selectors 125 and output stage circuits 122. The shift register circuit serves to shift a control signal inputted via a terminal DATA, in synchronism with a clock signal inputted to a terminal CLK. Further, combinations of terminals OC1 and OC2 connected with the selectors will place all of the output terminals at the VH level, at the GND voltage level, in the high impedance state or in a state of data delivery from the latch.

Figure 8:
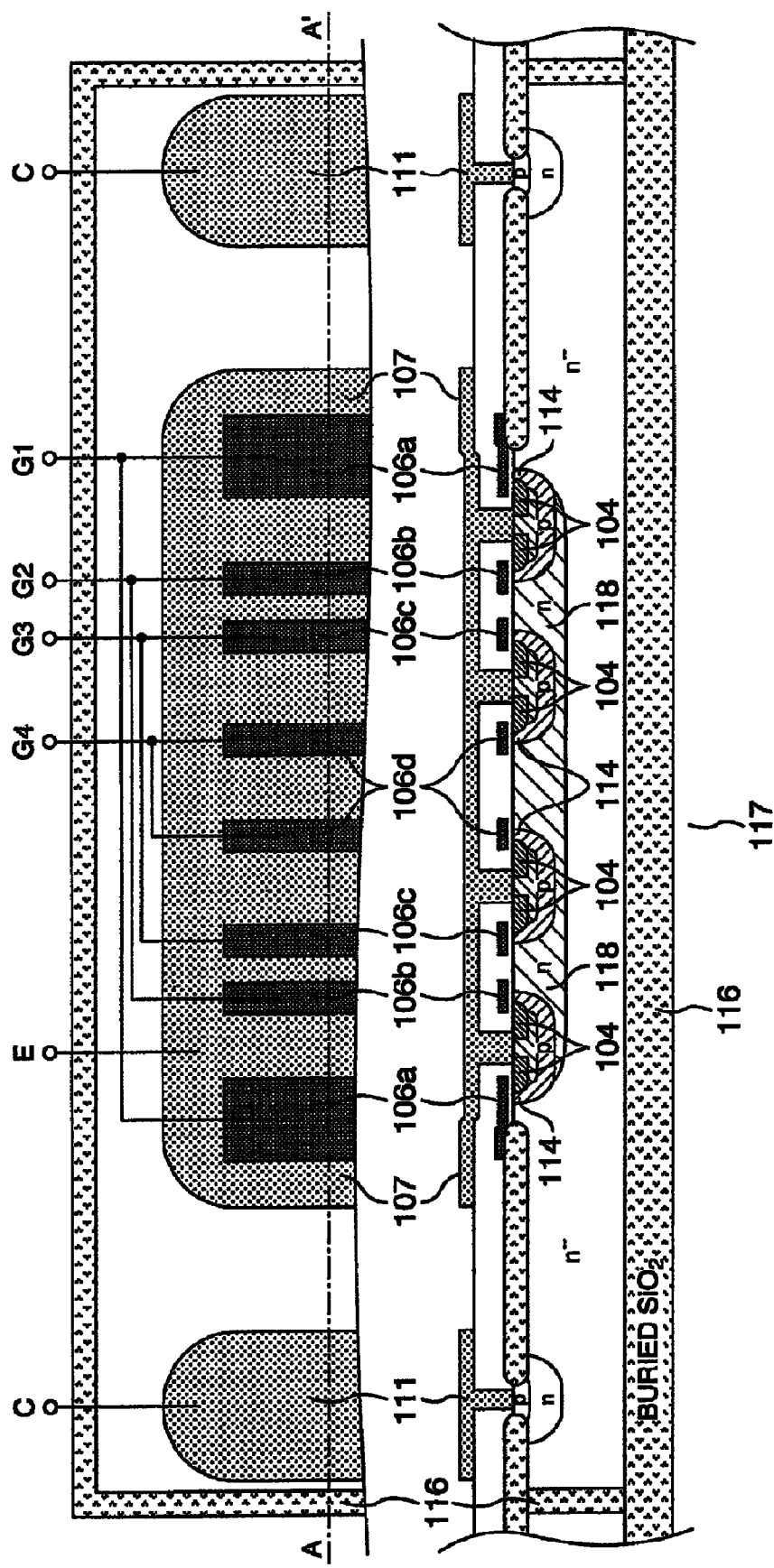
FIG. 8 shows in plan and in section a semiconductor device according to a fourth embodiment of the present invention.

FIG. 8 includes a plan view of a lateral IGBT according to an embodiment of the present invention and a sectional view taken along line A-A' on the plan view.

FIG. 8 shows a structure of one whole block consisting of a lateral IGBT in which a buried oxide film 116 is formed on a Si support substrate 117 of an SOI substrate. Although FIG. 8 shows only one block of a lateral IGBT, actually, a plurality of blocks of lateral IGBTs are formed on the support substrate 117.

This structure includes a structure similar to the lateral IGBT shown in FIG. 1 and is different therefrom only in that the gate electrode 106 is divided into separate electrodes connected with G1, G2, G3 and G4, respectively. By an individual on-off control of these separate gate electrodes G1, G2, G3 and G4, it is possible to vary on-voltage, saturation current and short-circuit blocking strength of the lateral IGBT.

Figure 9:
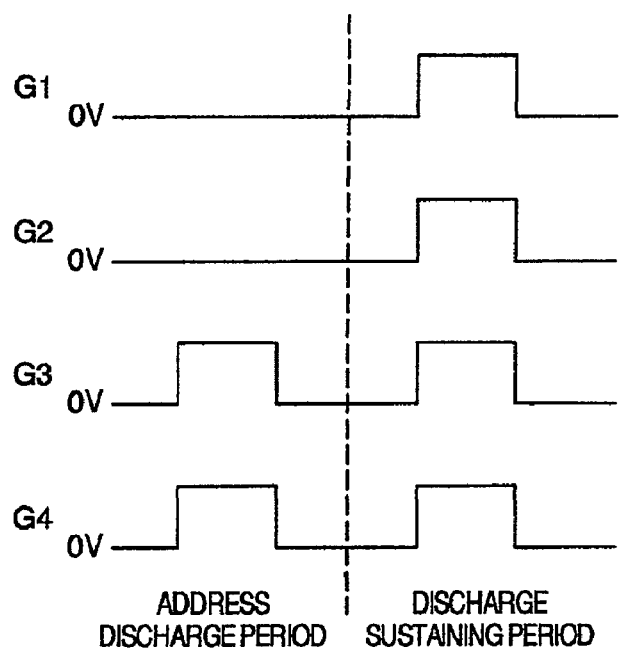
FIG. 9 is a diagram showing examples of gate electrode control signals for a semiconductor device according to the embodiment of the present invention shown in FIG. 8.

FIG. 9 is a diagram showing examples of control signals to the gate electrodes G1, G2, G3 and G4 of the lateral IGBT according to an embodiment of the present invention. When all of the gate electrodes are driven, larger current is permitted to flow at a low voltage, as in the lateral IGBT shown in FIG. 1, as compared with the conventional structure. On the other hand, when only the gates G3 and G4 are driven, although the on-voltage may be higher as compared to the case when all the gates are driven, the current density is lowered to enhance the short-circuit blocking strength.

FIG. 9 illustrates gate control signals to be used on an assumption that the lateral IGBT according to the embodiment of the present invention is applied to a semiconductor integrated circuit device for driving a plasma display. Briefly, the semiconductor integrated circuit device for driving a plasma display has two operation periods, an address discharge period and a discharge sustaining period. In the address discharge period, display data is written into discharge cells on a scanning line base, while in the discharge sustaining period, discharge sustaining pulses are applied to the scanning lines to sustain discharge. It is general that the semiconductor integrated circuit device for driving a plasma display is required to carry large current at a low voltage in the discharge sustaining cycle but such requirement is low in the address discharge cycle. Therefore, only the gate electrodes G3 and G4 should be driven for the address discharge, while all of the gates G1 to G4 should be driven for the discharge sustaining cycle. Thereby, a low on-voltage can be realized in the discharge sustaining cycle and an enhancement of the short-circuit blocking strength can be realized in the address discharge cycle.

As described above, owing to the enhancement of the short-circuit blocking strength in the address discharge cycle, it will be possible to decrease the possibilities of destruction of the output stage device when, for example, some output terminals of the semiconductor integrated circuit device for driving a plasma display are short-circuited to each other by foreign metal substances.

Figure 10:
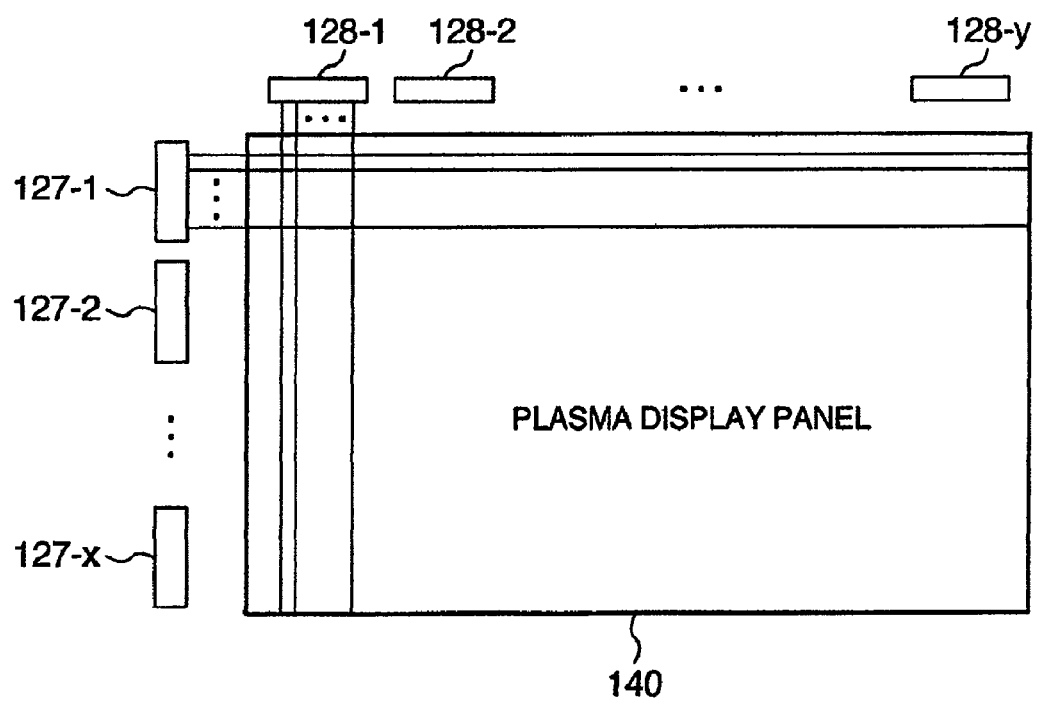
FIG. 10 is a diagram showing a plasma display panel to which a semiconductor device according to the embodiment of the present invention shown in FIG. 8 is applied.

FIG. 10 is a diagram showing a structure in which lateral IGBTs such as shown in FIG. 8 are applied to a plasma display panel 140 so that semiconductor integrated circuit devices 127 for driving a plasma display such as shown in FIG. 7 are provided.

Semiconductor integrated circuits 127-1 to 127-x are provided for the scanning line drive for the plasma display 140. Address drive semiconductor integrated circuits 128-1 to 128-y are provided for the address line drive. By effecting a gate control such as explained in connection with the above FIG. 9 embodiment, a plasma display panel can be provided in which a low on-voltage can be realized in the discharge sustaining cycle and the short-circuit blocking strength can be enhanced in the address discharge.

Further, it should be noted that IGBTs having a gate in a trench gate structure such as shown in FIG. 5 may also be employed as a semiconductor integrated circuit device for driving a plasma display.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device including: second conductivity-type base regions formed in a surface layer at a main surface of a first conductivity-type semiconductor substrate, each base region having therein first conductivity-type emitter regions; at least one gate electrode formed above the second conductivity-type base regions between said first conductivity-type semiconductor substrate and said first conductivity-type emitter regions; and second conductivity-type collector regions, at least two second conductivity-type base regions being provided between adjacent second conductivity-type collector regions; wherein a first conductivity-type region, having a concentration higher than that of said first conductivity-type semiconductor substrate, is provided between said at least two second conductivity-type base regions and under the second conductivity-type base regions.

2. A semiconductor device according to claim 1, wherein said gate electrode is in a trench gate structure.

3. A semiconductor device according to claim 1, wherein said first conductivity-type semiconductor substrate has a thickness not larger than 5 μm.

4. A semiconductor device according to claim 1, wherein said first conductivity-type semiconductor substrate has an impurity concentration not lower than $5.0 \times 10^{11}$ cm$^{-2}$ and not higher than $5.0 \times 10^{12}$ cm$^{-2}$.

5. A semiconductor integrated circuit device for driving a plasma display, comprising a semiconductor device as defined in claim 1.

6. A semiconductor integrated circuit device for driving a plasma display according to claim 5, further comprising a circuit for changing a number of said gate electrodes to be driven in accordance with operation conditions of a system.

7. A semiconductor device including: second conductivity-type base regions formed in a surface layer at a main surface of a first conductivity-type semiconductor substrate, each base region having therein first conductivity-type emitter regions; at least one gate electrode formed above said second conductivity-type base regions between said first conductivity-type semiconductor substrate and the first conductivity-type emitter regions; and second conductivity-type collector regions, at least two second conductivity-type base regions being provided between adjacent second conductivity-type collector regions; wherein a first conductivity-type region, having a concentration higher than that of said first conductivity-type semiconductor substrate, is provided to surround said at least two second conductivity-type base regions.

8. A semiconductor device including: second conductivity-type base regions formed in a surface layer at a main surface of a first conductivity-type semiconductor substrate, each base region having therein first conductivity-type emitter regions; at least one gate electrode formed above the second conductivity-type base regions between said first conductivity-type semiconductor substrate and said first conductivity-type emitter regions; and second conductivity-type collector regions, at least two second conductivity-type base regions being provided between adjacent second conductivity-type collector regions;

wherein a first conductivity-type region, having a concentration higher than that of said first conductivity type semiconductor substrate, is provided between said at least two second conductivity-type base regions and between said second conductivity-type regions and said first conductivity-type semiconductor substrate.

9. A semiconductor device according to claim 8, wherein said first conductivity-type region is provided to surround said at least two second conductivity-type based regions.

10. A semiconductor device according to claim 8, wherein said gate electrode is in a trench gate structure.

11. A semiconductor device according to claim 8, wherein said first conductivity-type semiconductor substrate has a thickness not larger than 5 μm.

12. A semiconductor device according to claim 8, wherein said first conductivity-type semiconductor substrate has an impurity concentration not lower than $5.0 \times 10^{11}$ cm$^{-2}$ and not higher than $5.0 \times 10^{12}$ cm$^{-2}$.

13. A semiconductor integrated circuit device for driving a plasma display, comprising a semiconductor device as defined in claim 8.

14. A semiconductor integrated circuit device for driving a plasma display according to claim 13, further comprising a circuit for changing a number of said gate electrodes to be driven in accordance with operation conditions of a system.

* * * * *